United States Patent
Ikeda et al.

(10) Patent No.: US 6,717,328 B2
(45) Date of Patent: Apr. 6, 2004

(54) PIEZOELECTRIC RESONATOR AND FM DETECTION CIRCUIT INCORPORATING THE SAME

(75) Inventors: Yoshihiro Ikeda, Toyama (JP); Kunio Sawai, Ishikawa-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 160 days.

(21) Appl. No.: 10/090,150

(22) Filed: Mar. 5, 2002

(65) Prior Publication Data

US 2002/0185938 A1 Dec. 12, 2002

(30) Foreign Application Priority Data

Mar. 27, 2001 (JP) ........................................ 2001-089064

(51) Int. Cl.[7] .............................. H02N 1/04; H02N 2/00; H01L 41/04; H01L 41/18; H01L 41/08
(52) U.S. Cl. ....................................... 310/315; 29/25.35
(58) Field of Search ........................................... 310/315

(56) References Cited

U.S. PATENT DOCUMENTS

| | | | | |
|---|---|---|---|---|
| 4,384,229 A | * | 5/1983 | Inoue et al. | 310/315 |
| 4,608,506 A | * | 8/1986 | Tanuma | 310/315 |
| 4,652,784 A | * | 3/1987 | Inoue et al. | 310/320 |
| 5,424,601 A | * | 6/1995 | Arnolds et al. | 310/315 |
| 5,705,957 A | * | 1/1998 | Oka et al. | 331/66 |
| 5,747,857 A | * | 5/1998 | Eda et al. | 257/416 |

FOREIGN PATENT DOCUMENTS

| JP | 59181585 A | * | 10/1984 | H01L/41/08 |
|---|---|---|---|---|
| JP | 61-136630 | | 8/1986 | H03H/9/13 |
| JP | 62261208 A | * | 11/1987 | H03H/7/01 |
| JP | 63-283215 | | 11/1988 | H03D/3/16 |
| JP | 01189531 A | * | 7/1989 | G01L/1/10 |
| JP | 04017579 A | * | 1/1992 | H02N/2/00 |
| JP | 07038365 A | * | 2/1995 | H03H/3/02 |
| JP | 08018369 A | * | 1/1996 | H03H/3/02 |
| JP | 2501521 | | 4/1996 | H03D/3/06 |
| JP | 200290197 A | * | 10/2002 | H03H/9/17 |

OTHER PUBLICATIONS

Onoe et al., Useful Formula for Piezoelectric Ceramic Resonators and Their Application to Measurement of Parameters, The Journal of the Acoustical Society of America, vol. 41, No. 4, Part 2, 1967 pp. 974–980.*

* cited by examiner

Primary Examiner—Nicholas Ponomarenko
Assistant Examiner—J. Aguirrechea
(74) Attorney, Agent, or Firm—Keating & Bennett, LLP (57) ABSTRACT

In a piezoelectric resonator, the temperature coefficient $\epsilon_{TC}$ of the capacitance of the piezoelectric material, the bandwidth ratio $\Delta f/fo$, the temperature coefficient $Fr_{TC}$ of the resonance frequency, the temperature coefficient $Fa_{TC}$ of the anti-resonance frequency, and a target value $\alpha$ for the temperature coefficient of the center frequency satisfy the following expression:

$$|(Fr_{TC}+Fa_{TC})/2+K\times\epsilon_{TC}\times(\Delta f/fo)|\leq\alpha$$

where K=a coefficient determined according to the impedance at the midpoint between Fr and Fa; $\epsilon_{TC}$=A×(the amount of change in capacitance in a measured temperature range)/(the capacitance at a reference temperature×the measured temperature range); $\Delta f/fo$=(Fa at the reference temperature–Fr at the reference temperature)/(fo at the reference temperature); $Fr_{TC}$=A×(the amount of change in Fr in the measured temperature range)/(Fr at the reference temperature×the measured temperature range); $Fa_{TC}$=A×(the amount of change in Fa in the measured temperature range)/(Fa at the reference temperature×the measured temperature range); and A=a coefficient of +1 for a positive temperature coefficient and −1 for a negative temperature coefficient.

18 Claims, 7 Drawing Sheets

PIEZOELECTRIC RESONATOR AND FM DETECTION CIRCUIT INCORPORATING THE SAME

BACKGROUND OF THE INVENTION

1. Field of the Invention

The present invention relates to a piezoelectric resonator and an FM detection circuit incorporating the same.

2. Description of the Related Art

A phase shifter of an FM detection circuit which detects changes in the frequency of an FM wave by detecting changes in voltages has conventionally been used in a discriminator. Generally, to achieve a wide demodulation output bandwidth, piezoelectric materials that produce a low Q and a wide bandwidth ΔF (=Fa−Fr) are used for the discriminator. However, the relationship of various temperature coefficients of the piezoelectric materials has not been appropriate, resulting in a relatively large temperature coefficient ($fo_{TC}$) of the finished product. Thus, the guaranteed operation temperature range of a device incorporating the discriminator has been narrower than discriminators that incorporate a ceramic filter, which prevents the use of the discriminator in various devices.

The temperature coefficient ($fo_{TC}$) of a discriminator in a finished product has been on the order of 25 ppm/° C., which corresponds to a frequency change of approximately 28 kHz in a temperature range of 100° C. and approximately 40 kHz in a temperature range of 150° C. Furthermore, in discriminators which have previously been available, frequency change has tended to be greater at temperatures above 20° C. Thus, the upper limit of the guaranteed operation temperature range has often been set to 60° C. in order to meet general specifications for $fo_{TC}$ which assume a change of ±300 kHz in fo.

In order to counter the problems described above, Japanese Unexamined Patent Application Publication No. 63-283215 discloses a device in which a capacitor is connected in series to a discriminator (piezoelectric resonator) and the temperature coefficient of the capacitance of the discriminator and the temperature coefficient of the capacitance of the capacitor satisfy a predetermined relationship, such that a change in the frequency-impedance characteristics associated with a temperature change in the discriminator is cancelled by the temperature characteristics of the capacitor, thus reducing a shift in frequency.

Furthermore, Japanese Registered Utility Model No. 2501521 discloses a bridge circuit with resistors connected respectively on three sides thereof and a discriminator (piezoelectric resonator) connected on the remaining side, in which a capacitor having temperature characteristics equivalent to those of the discriminator connected in parallel to one of the resistors.

However, each of the proposals requires use a capacitor in addition to a discriminator and thus requires control of the temperature characteristics of the capacitor which increases the uncertainties. Thus, it has been difficult to provide an FM detection circuit which achieves desired temperature characteristics.

SUMMARY OF THE INVENTION

To overcome the above-described problems, preferred embodiments of the present invention provide a piezoelectric resonator and an FM detection circuit incorporating the same, in which various temperature coefficients of the piezoelectric material are optimized, such that a finished product has stable temperature characteristics and a guaranteed operation temperature range that is greatly increased.

According to a preferred embodiment of the present invention, piezoelectric resonator is provided, wherein the temperature coefficient $\epsilon_{TC}$ of the capacitance of the piezoelectric material, the bandwidth ratio Δf/fo, the temperature coefficient $Fr_{TC}$ of the resonance frequency, the temperature coefficient $Fa_{TC}$ of the anti-resonance frequency, and a target value α for the temperature coefficient of the center frequency satisfy the following expression:

$$|(Fr_{TC}+Fa_{TC})/2+K\times\epsilon_{TC}\times(\Delta f/fo)|\leq\alpha \qquad (1)$$

where K=a coefficient determined according to the impedance at the midpoint between Fr and Fa; $\epsilon_{TC}$=A×(the amount of change in capacitance in a measured temperature range)/(the capacitance at a reference temperature×the measured temperature range); Δf/fo=(Fa at the reference temperature−Fr at the reference temperature)/(fo at the reference temperature); $Fr_{TC}$=A×(the amount of change in Fr in the measured temperature range)/(Fr at the reference temperature×the measured temperature range); $Fa_{TC}$=A×(the amount of change in Fa in the measured temperature range)/(Fa at the reference temperature×the measured temperature range); and A=a coefficient of +1 for a positive temperature coefficient and −1 for a negative temperature coefficient.

In accordance this preferred embodiment, because the piezoelectric material is selected such that the temperature coefficient of the capacitance and the temperature coefficient of the anti-resonance frequency cancel each other, the amount of change in the center frequency fo associated with a temperature change is greatly reduced, i.e., the temperature coefficient $fo_{TC}$ of the center frequency fo is reduced. Thus, the piezoelectric resonator has a wider guaranteed operation temperature range which produces a wider guaranteed operation temperature range in a device incorporating the piezoelectric resonator. Furthermore, because a capacitor for improving temperature characteristics need not be connected separately, the structure is greatly simplified and desired temperature characteristics are achieved.

In a piezoelectric resonator that is sealed by a packaging resin, in addition to the temperature coefficients of the piezoelectric resonator, the temperature coefficient $Rfo_{TC}$ of the center frequency related to a stress of the packaging resin is also taken into consideration such that the following expression is satisfied:

$$|(Fr_{TC}+Fa_{TC})/2+K\times\epsilon_{TC}\times(\Delta f/fo)+Rfo_{TC}|\leq\alpha \qquad (2)$$

Accordingly, the effects of the temperature coefficient of the packaging resin are eliminated, such that stable temperature characteristics are achieved in a piezoelectric resonator sealed by a packaging resin.

Another preferred embodiment of the present invention provides a method of calculating a temperature coefficient of a piezoelectric resonator, wherein the temperature coefficient $fo_{TC}$ of the center frequency is calculated according to the following approximate expression from the temperature coefficient $\epsilon_{TC}$ of the capacitance of the piezoelectric material, the bandwidth ratio Δf/fo, the temperature coefficient $Fr_{TC}$ of the resonance frequency, and the temperature coefficient $Fa_{TC}$ of the anti-resonance frequency:

$$fo_{TC}=(Fr_{TC}+Fa_{TC})/2+K\times\epsilon_{TC}\times(\Delta f/fo) \qquad (3)$$

where K=a coefficient determined according to the impedance at the midpoint between Fr and Fa; $\epsilon_{TC}$=A×(the amount of change in capacitance in a measured temperature range)/(the capacitance at a reference temperature×the measured temperature range); Δf/fo=(Fa at the reference temperature−Fr at the reference temperature)/(fo at the reference temperature); $Fr_{TC}$=A×(the amount of change in Fr in the measured temperature range)/(Fr at the reference temperature×the measured temperature range); $Fa_{TC}$=A×(the amount of change in Fa in the measured temperature range)/(Fa at the reference temperature×the measured temperature range); and A=a coefficient of +1 for a positive temperature coefficient and −1 for a negative temperature coefficient.

In a piezoelectric resonator sealed by a packaging resin, in addition to the temperature coefficients of the piezoelectric resonator, the temperature coefficient $Rfo_{TC}$ of the center frequency of a stress of the packaging resin is also taken into consideration so that the temperature coefficient $fo_{TC}$ of the center frequency is calculated according to the following expression:

$$fo_{TC}=(Fr_{TC}+Fa_{TC})/2+K\times\epsilon_{TC}\times(\Delta f/fo)+Rfo_{TC} \quad (4)$$

Accordingly, the temperature coefficient $fo_{TC}$ of a piezoelectric resonator can readily be calculated from the temperature coefficient $\epsilon_{TC}$ of the capacitance of the piezoelectric material, the bandwidth ratio Δf/fo, the temperature coefficient $Fr_{TC}$ of the resonance frequency, and the temperature coefficient $Fa_{TC}$ of the anti-resonance frequency, which facilitates circuit design.

The target value α for the temperature coefficient of the center frequency is preferably 18 ppm/° C. More specifically, assuming the center frequency fo=10.7 MHz, if the temperature characteristics $fo_{TC}$ of the center frequency of a piezoelectric resonator in a finished product is within ±18 ppm/° C., which corresponds to a frequency change of approximately ±29 kHz in a temperature range of 150° C., an operation temperature range of, for example, −40° C. to 105° C. is guaranteed. That is, compared with the prior art in which the upper limit of the guaranteed operation temperature range is 60° C., the upper limit is increased to 105° C. according to the present invention.

The coefficient K determined according to the impedance at the midpoint between Fr and Fa is, for example, 0.225. In a piezoelectric resonator in which the center frequency fo is set where the impedance is 1 kΩ, using K=0.225, the difference between the temperature coefficient $fo_{TC}$ of the center frequency and the average of the temperature coefficient $Fr_{TC}$ of the resonance frequency and the temperature coefficient $Fa_{TC}$ of the anti-resonance frequency is substantially proportional to the product of the temperature characteristics $\epsilon_{TC}$ of the capacitance and the bandwidth ratio, which allows for an accurate calculation of the temperature coefficient $fo_{TC}$ of the center frequency.

Another preferred embodiment of the present invention provides an FM detection circuit including a bridge circuit with resistors connected on three sides thereof and a piezoelectric resonator as described above connected on the remaining side, wherein an FM intermediate-frequency signal is input across one of the pairs of opposite nodes of the bridge circuit and output across the other pair of opposite nodes.

Accordingly, the temperature characteristics of the center frequency fo are stable which serves to increase the guaranteed operation temperature range of an FM detection circuit.

Other features, characteristics, characteristics and advantages of the present invention will become more apparent from the following detailed description of preferred embodiments thereof with reference to the attached drawings.

DETAILED DESCRIPTION OF PREFERRED EMBODIMENTS

The following describes how the present invention has been made.

Figure 1:
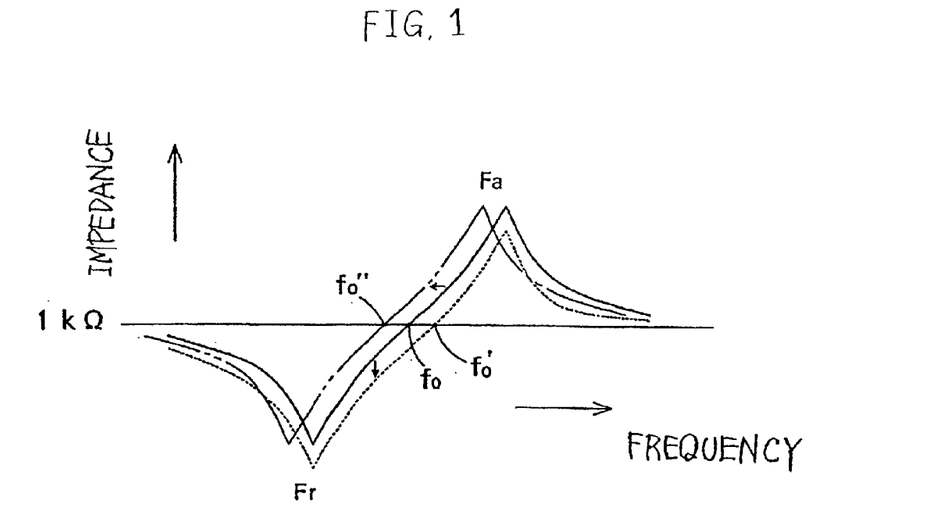
FIG. 1 is a frequency-impedance characteristics diagram that explains the principles of the present invention.

Generally, in piezoelectric ceramic materials, the temperature coefficient $\epsilon_{TC}$ of the capacitance across terminals is a positive value, i.e., the capacitance increases as the temperature rises. More specifically, as the temperature rises, the impedance of a piezoelectric resonator decreases due to the temperature characteristics of the capacitance, whereby the center frequency fo is shifted toward higher frequencies (indicated by fo'), as indicated by a dashed line in FIG. 1. In this example, the center frequency fo is set where the impedance is 1 kΩ. On the other hand, the temperature coefficient $Fr_{TC}$ of the resonance frequency and the temperature coefficient $Fa_{TC}$ of the anti-resonance frequency have negative values. Thus, when the temperature rises, the frequencies $Fr_{TC}$ and $Fa_{TC}$ decrease as indicated by a double-dotted chain line in FIG. 1, whereby the center frequency is shifted toward lower frequencies (indicated by fo"). Because the shifts are cancelled by each other, the amount of change in the center frequency fo associated with temperature change is greatly reduced which greatly improves the temperature coefficient $fo_{TC}$ of the center frequency fo.

Accordingly, the inventors measured the temperature coefficient $\epsilon_{TC}$ of the capacitance, the bandwidth ratio Δf/fo, the temperature coefficient $Fr_{TC}$ of the resonance frequency, the temperature coefficient $Fa_{TC}$ of the anti-resonance frequency, and the temperature coefficient $fo_{TC}$ of the center frequency for various piezoelectric materials, and discovered a specific relationship among them.

More specifically, the inventors discovered that the difference between the temperature coefficient $fo_{TC}$ of the center frequency and the average of the temperature coefficient $Fr_{TC}$ of the resonance frequency and the temperature coefficient $Fa_{TC}$ of the anti-resonance frequency is proportional to the product of the temperature coefficient $\epsilon_{TC}$ of the capacitance and the bandwidth ratio Δf/fo. That is, the temperature coefficient $fo_{TC}$ of the center frequency is approximately calculated from the temperature coefficient $Fr_{TC}$ of the resonance frequency, the temperature coefficient $Fa_{TC}$ of the anti-resonance frequency, the temperature coefficient $\epsilon_{TC}$ of the capacitance, and the bandwidth ratio $\Delta f/fo$.

Thus, the temperature coefficient $fo_{TC}$ of a finished product is maintained within a target value $\alpha$ for the temperature coefficient $fo_{TC}$ of the center frequency by determining the temperature coefficient $\epsilon_{TC}$ of the capacitance, the bandwidth ratio $\Delta f/fo$, the temperature coefficient $Fr_{TC}$ of the resonance frequency, and the temperature coefficient $Fa_{TC}$ of the anti-resonance frequency in accordance with the proportional relationship.

Table 1 shows the temperature coefficients and the bandwidth ratio for thickness shear vibration mode piezoelectric resonators using five types of PZT piezoelectric materials A to E, respectively. The center frequency fo of each of the piezoelectric resonators occurred at where the impedance is 1 kΩ (fo=10.7 MHz).

TABLE 1

| | Material | | | | |
|---|---|---|---|---|---|
| Characteristics | A | B | C | D | E |
| $fo_{TC}$ (ppm/° C.) | −27 | −5.3 | 11 | 16 | 20 |
| $Fr_{TC}$ (ppm/° C.) | −116 | −93.1 | −38 | −56 | 54 |
| $Fa_{TC}$ (ppm/° C.) | −79 | −23.4 | −5 | −11 | −6 |
| $\epsilon_{TC}$ (ppm/° C.) | 3660 | 2431 | 2040 | 2380 | 2210 |
| $\Delta f/fo$ | 0.087 | 0.097 | 0.064 | 0.093 | 0.101 |

In Table 1, A indicates a piezoelectric resonator using a ready-made piezoelectric material for discriminators, and B to E indicate new piezoelectric resonators prepared for this experiment.

Table 2 shows the product of the temperature coefficient $\epsilon_{TC}$ of the capacitance and the bandwidth ratio $\Delta f/fo$ and the difference between the temperature coefficient $fo_{TC}$ of the center frequency and the average of the temperature coefficient $Fr_{TC}$ of the resonance frequency and the temperature coefficient $Fa_{TC}$ of the anti-resonance frequency for each of the samples A to E, which were obtained using the temperature coefficients and the bandwidth ratio in Table 1.

TABLE 2

| | A | B | C | D | B |
|---|---|---|---|---|---|
| $\epsilon_{TC} \times \Delta f/fo$ | 318.42 | 235.807 | 130.56 | 221.34 | 223.21 |
| $fo_{TC} - (Fr_{TC} + Fa_{TC})/2$ | 70.5 | 52.95 | 32.5 | 49.5 | 50 |

Figure 2:
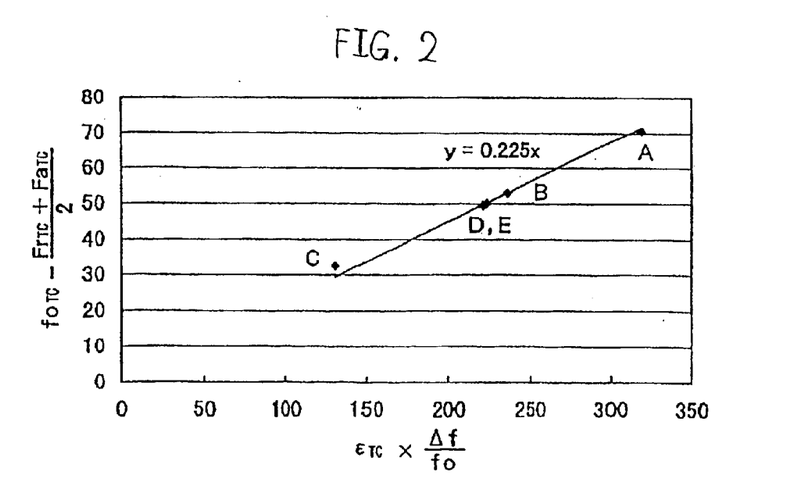
FIG. 2 is a characteristics diagram to derive an expression according to the present invention.

FIG. 2 plots each of the samples A to E in Table 2, with the horizontal axis representing the product of the temperature coefficient $\epsilon_{TC}$ of the capacitance and the bandwidth ratio $\Delta f/fo$ and the vertical axis representing the difference between the temperature coefficient $fo_{TC}$ of the center frequency and the average of the temperature coefficient $Fr_{TC}$ of the resonance frequency and the temperature coefficient $Fa_{TC}$ of the anti-resonance frequency.

As shown in FIG. 2, the values of all the samples A to E are on a single straight line y=0.225x. That is, the temperature coefficient $fo_{TC}$ of the center frequency is approximated as follows:

$$fo_{TC}=(Fr_{TC}+Fa_{TC})/2+0.225\times\epsilon_{TC}\times(\Delta f/fo)$$

For the target value $\alpha$ for the temperature coefficient of the center frequency, stable temperature characteristics of a piezoelectric are achieved by determining the temperature coefficient $\epsilon_{TC}$ of the capacitance, the bandwidth ratio $\Delta f/fo$, the temperature coefficient $Fr_{TC}$ of the resonance frequency, and the temperature coefficient $Fa_{TC}$ of the anti-resonance frequency such that the following expression is satisfied:

$$|(Fr_{TC}+Fa_{TC})/2+0.225\times\epsilon_{TC}\times(\Delta f/fo)|\leq\alpha$$

Expressions (3) and (1) are generalized forms of the above expressions.

In the above example, a coefficient K=0.225 is used because the center frequency fo of the piezoelectric resonator occurs where the impedance is 1 kΩ. However, the value of coefficient K differs with a piezoelectric resonator having center frequency fo that occurs where the impedance is a different value.

In an FM detection circuit incorporating a bridge balance circuit, the impedance associated with the center frequency fo is determined based on the resistance of resistors $R_1$, $R_2$, and $R_3$ in a detection IC. Thus, the impedance associated with the center frequency fo differs among ICs. However, because R of most ICs for FM detection is in the vicinity of 1 kΩ (with variations of about 200 to about 300 Ω), outstanding temperature characteristics are achieved with most ICs in which the frequency that occurs when the impedance Z=1 kΩ is stable.

Table 3 shows a comparison between the temperature coefficient $fo_{TC}$ calculated according to the above expression and the temperature coefficient $fo_{TC}$ that were actually measured.

As shown in Table 3, the calculated values and the measured values are similar which demonstrates the accuracy of Expressions (1) and (3) according to the present invention. Furthermore, compared with the piezoelectric resonator A made of a ready-made material, the piezoelectric resonators B to E made newly prepared materials exhibit outstanding temperature characteristics, particularly the piezoelectric resonators B to D.

TABLE 3

| | A | B | C | D | E |
|---|---|---|---|---|---|
| $fo_{TC}$ (calculated) | −26 | −5 | 8 | 16 | 20 |
| $fo_{TC}$ (measured) | −27 | −5 | 11 | 16 | 20 |

Figure 3:
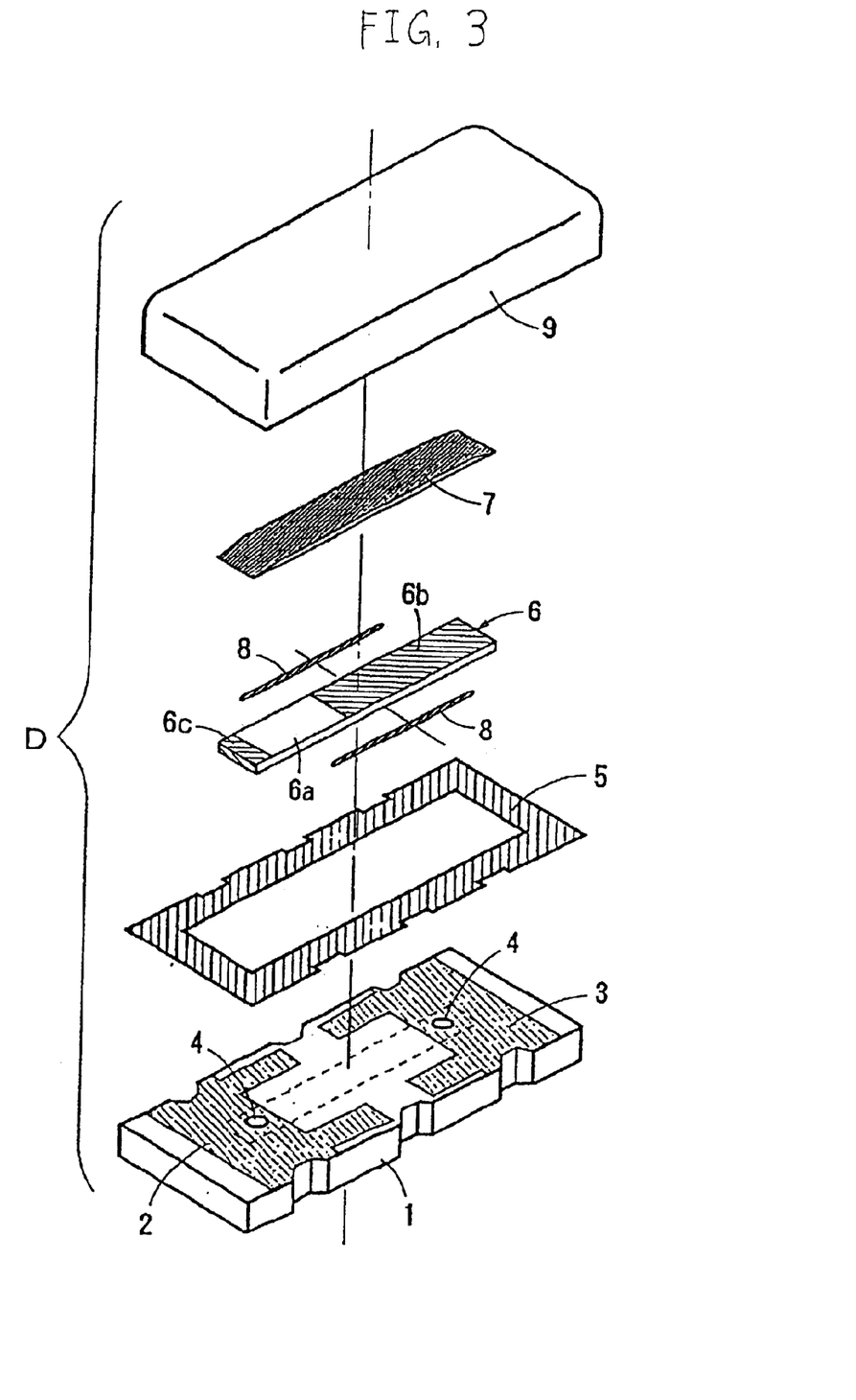
FIG. 3 is an exploded perspective view of a piezoelectric resonator according to a first preferred embodiment of the present invention.

FIG. 3 shows a piezoelectric resonator according to a first preferred embodiment of the present invention, implemented as a chip-type discriminator D.

The discriminator D includes an insulating substrate 1, a frame-shaped insulating layer 5 composed of, for example, glass paste, provided on the substrate 1, a piezoelectric element 6 fixed and connected via conductive paste 4 to electrodes 2 and 3 provided on the substrate 1, damping members 7 and 8 composed of, for example, silicone rubber, coated on a top surface and both side surfaces of the piezoelectric element 6, a metallic cap 9 fixed via a bonding agent (not shown) on the insulating layer 5 of the substrate 1 and encapsulating the piezoelectric element 6.

The piezoelectric element 6 is an energy-trap thickness shear vibration mode element, and includes a strip-shaped piezoelectric substrate 6a. On a top surface and a bottom surface of the piezoelectric substrate 6a, electrodes 6b and 6c are provided to oppose each other at central regions. The electrodes 6b and 6c extend to the opposite principal surfaces via the edges of the respective ends of the piezoelectric substrate 6a. The material of the piezoelectric substrate 6a is a PZT material.

Figure 4A:
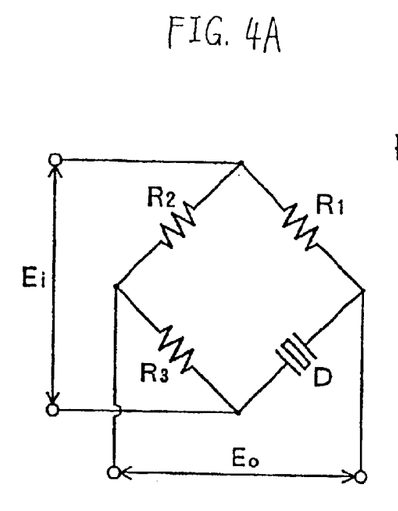
FIGS. 4A and 4B are, respectively, a circuit diagram and a phase characteristics diagram of a phase shifter implemented in the form of a bridge circuit.

FIG. 4A shows an example of phase shifter circuit used in an FM detection circuit. The phase shifter circuit is defined by a bridge balance circuit including three resistors R1, R2, and R3 connected on three sides thereof and the discriminator D connected on the remaining side. The resistance of each of the resistors R1, R2, and R3 is 1 kΩ, and the center frequency fo of the discriminator D occurs at a frequency with an impedance of 1 kΩ. In this preferred embodiment, the center frequency fo is about 10.7 MHz.

Figure 4B:
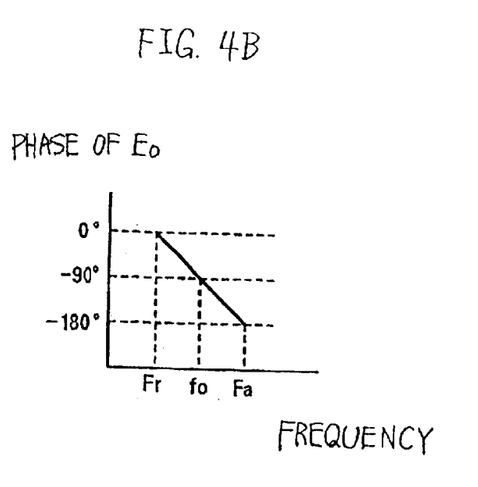

FIG. 4B shows change in the phase of output voltage Eo. As shown in FIG. 4B, at the center frequency fo, an output voltage Eo is shifted by 90 degrees relative to a corresponding input voltage Ei.

The characteristics of the PZT material defining the piezoelectric element 6 are as follows:

Temperature coefficient of resonance frequency $Fr_{TC}$=−90 ppm/° C.;

Temperature coefficient of anti-resonance frequency $Fa_{TC}$=−25 ppm/° C.;

Temperature coefficient of capacitance $\epsilon_{TC}$=+2430 ppm/° C;

Bandwidth ratio Δf/fo=10%;

$Fr_{TC}$, $Fa_{TC}$, $\epsilon_{TC}$, and Δf/fo were determined according to the following formulas based on measurements in a temperature range of −20° C. to +85° C. with a reference temperature of +20° C.:

$Fr_{TC}$=A×(the amount of change in Fr in the measured temperature range)/(Fr at the reference temperature×the measured temperature range);

$Fa_{TC}$=A×(the amount of change in Fa in the measured temperature range)/(Fa at the reference temperature×the measured temperature range); and $\epsilon_{TC}$=A×(the amount of change in capacitance in the measured temperature range)/(the capacitance at the reference temperature×the measured temperature range);

Δf/fo=(Fa at the reference temperature−Fr at the reference temperature)/(fo at the reference temperature);

where A is a coefficient of +1 for a positive temperature coefficient and −1 for a negative temperature coefficient.

Assigning the characteristic values into Expression (3), the temperature coefficient $fo_{TC}$ of the center frequency was calculated as follows:

$$fo_{TC}=(Fr_{TC}+Fa_{TC})/2+K\times\epsilon_{TC}\times(\Delta f/fo)=(-90-25)/2+K\times 2430\times 0.1$$

In a piezoelectric resonator in which the center frequency fo occurs where the impedance is 1 kΩ, K=0.225 and thus $fo_{TC}$=−2.83 ppm/° C.

With the target α of the temperature coefficient of the center frequency set to α=18 ppm/° C., |$fo_{TC}$|=2.83 ppm/° C. is sufficiently less than the target value α and Expression (1) is thus satisfied. The temperature coefficient $fo_{TC}$ of the finished chip-type discriminator for FM detection, shown in FIG. 3, was measured to be approximately −3 ppm/° C., thus exhibiting excellent temperature characteristics.

Figure 5:
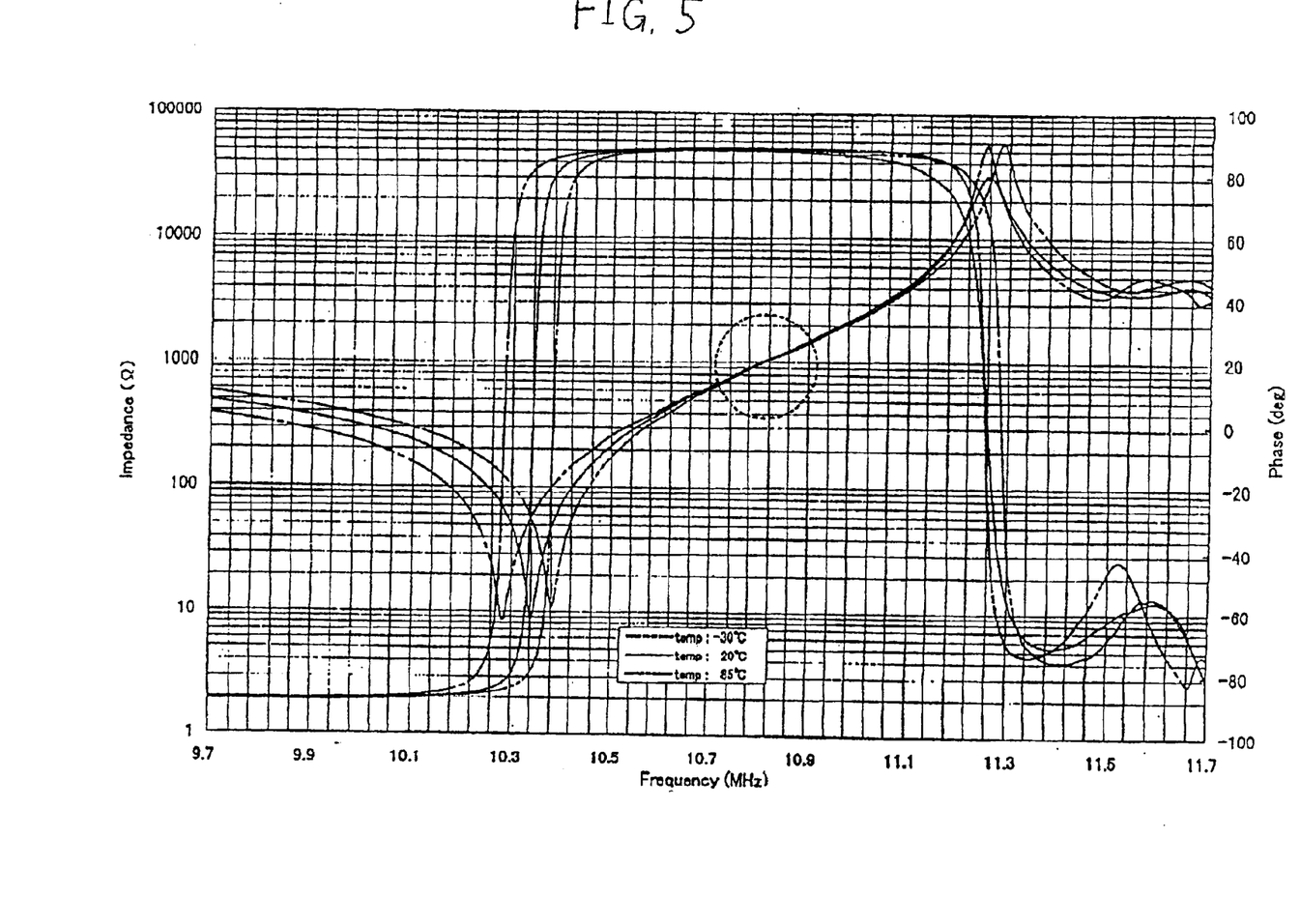
FIG. 5 is a graph showing the impedance characteristics and phase characteristics of the piezoelectric resonator shown in FIG. 3.

FIG. 5 shows the impedance characteristics and phase characteristics of the chip-type discriminator D according to the preferred embodiment shown in FIG. 3 at temperatures of −30° C., 20° C., and 85° C.

Figure 6:
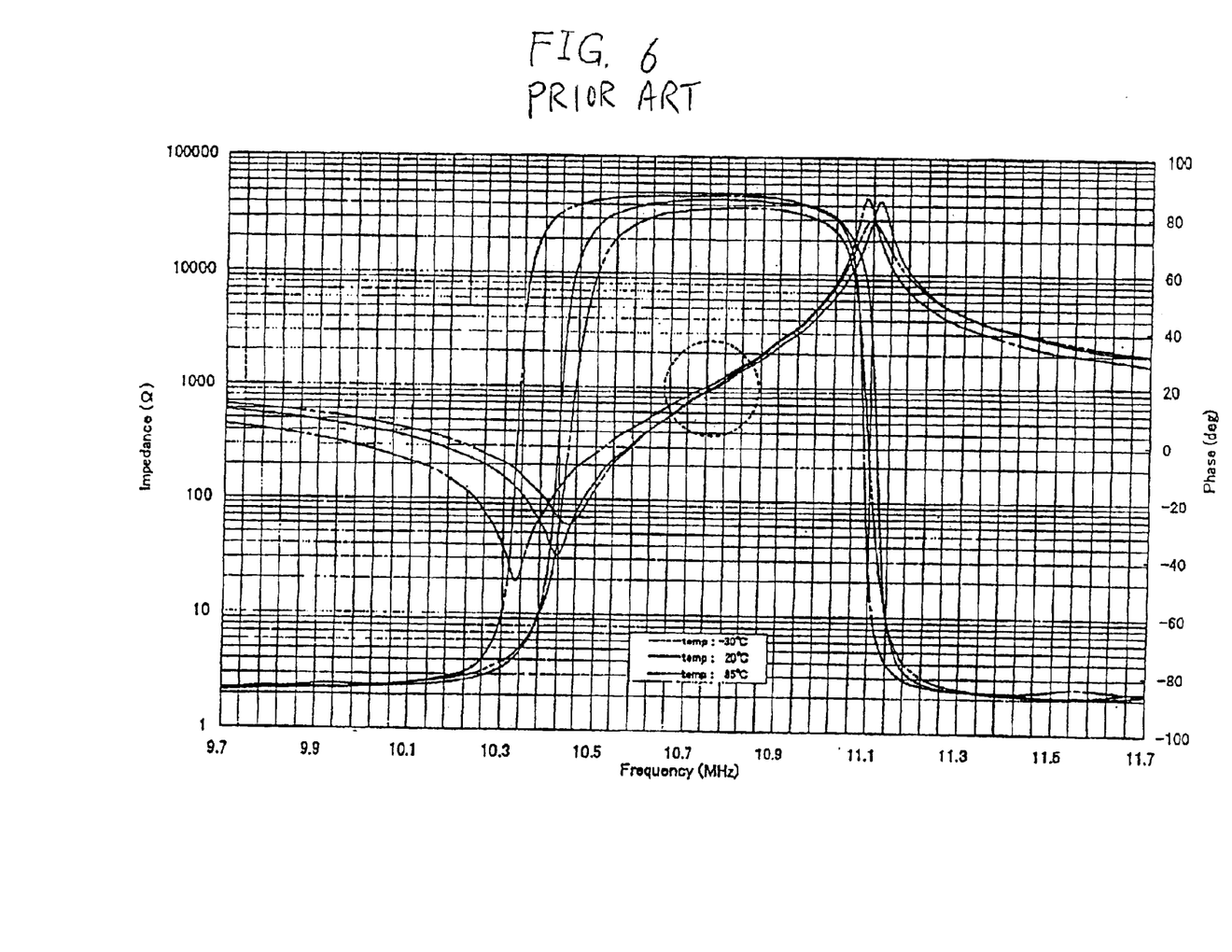
FIG. 6 is a graph showing the impedance characteristics and phase characteristics of a piezoelectric resonator according to the prior art.

FIG. 6 shows the impedance characteristics and phase characteristics of a chip-type discriminator according to the prior art at temperatures of −30° C., 20° C., and 85° C., for example, a chip-type piezoelectric resonator of a known laminated construction disclosed in Japanese Unexamined Utility Model Application Publication No. 61-136630, and the vibration mode of the piezoelectric element was the thickness longitudinal vibration mode.

As shown in FIG. 6, in the chip-type discriminator according to the prior art, the frequency at which the impedance Z=1 kΩ changes as the temperature changes. This is a factor contributing to an increased value of $fo_{TC}$. In contrast, in the chip-type discriminator according to the preferred embodiment, the frequency at which Z=1 kΩ remains substantially the same irrespective of the temperature changes, as shown in FIG. 5.

Figure 7A:
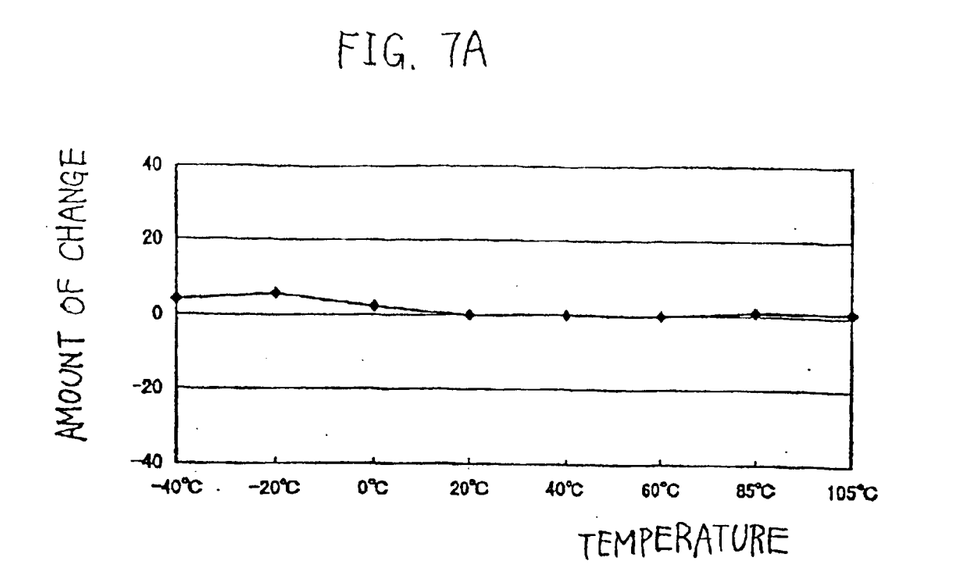
FIGS. 7A and 7B are graphs showing the temperature characteristics of the piezoelectric resonator according to the embodiment and the piezoelectric resonator according to the related art, respectively.
Figure 7B:
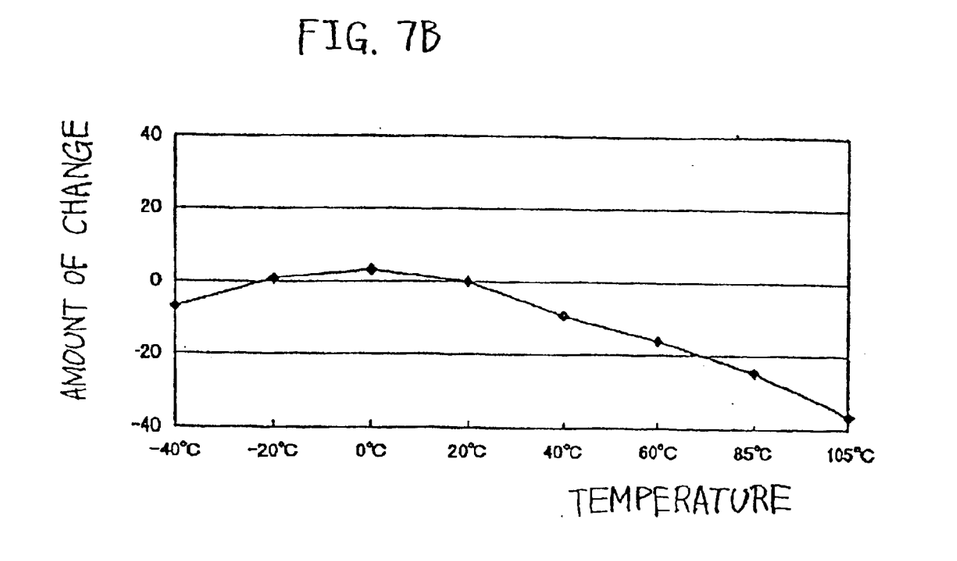

FIG. 7A shows the temperature characteristics of the chip-type discriminator according to the preferred embodiment shown in FIG. 5, and FIG. 7B shows the temperature characteristics of the chip-type discriminator according to the prior art shown in FIG. 6.

As is apparent from FIGS. 7A and 7B, in the chip-type discriminator according to the prior art, the center frequency fo changes considerably as the temperature increases, whereas in the chip-type discriminator according to the preferred embodiment, the center frequency fo remains substantially the same even when the temperature increases up to 105° C., thus exhibiting excellent temperature characteristics.

Figures 8A, 8B:
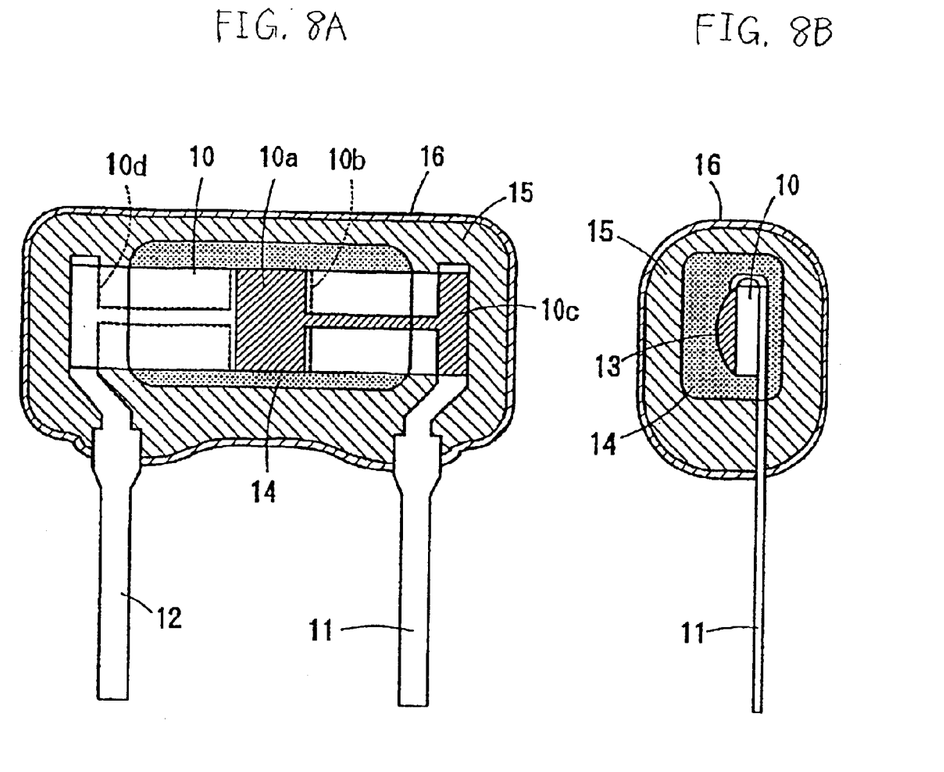
FIGS. 8A and 8B are, respectively, a front sectional view and a side sectional view of a piezoelectric resonator according to a second preferred embodiment.

FIG. 8 shows a piezoelectric resonator according to a second preferred embodiment of the present invention.

The piezoelectric resonator is sealed by a resin and leaded, and similarly to the first preferred embodiment, the piezoelectric resonator according to the second preferred embodiment is used as a discriminator for FM detection.

The piezoelectric resonator includes a strip-shaped thickness shear vibration mode piezoelectric element 10 with a center frequency fo=10.7 MHz. On the central portions of a top surface and a bottom surface of the piezoelectric element 10, vibrating electrodes 10a and 10b are provided, and on both ends of the piezoelectric element 10, terminal electrodes 10c and 10d are provided. Lead terminals 11 and 12 are attached to the terminal electrodes 10c and 10d via solder 13. One lead terminal 11 is folded back from the bottom surface to the top surface of the piezoelectric element 10. The periphery of the vibrating electrodes 10a and 10b of the piezoelectric element 10 is covered with an elastic member 14 composed of silicone rubber, and the entire periphery of the piezoelectric element 10 is covered with a packaging resin 15 composed of epoxy resin. Furthermore, the periphery of the packaging resin 15 is covered with a surface resin 16 composed of transparent epoxy resin.

The characteristics of the PZT material of which the piezoelectric element 10 is composed are as follows:

Temperature coefficient of resonance frequency $Fr_{TC}$=−90 ppm/° C.;

Temperature coefficient of anti-resonance frequency $Fa_{TC}$=−25 ppm/° C.;

Temperature coefficient of capacitance $\epsilon_{TC}$=+2430 ppm/° C.;

Bandwidth ratio Δf/fo=10%;

Furthermore, an experiment indicated that the temperature coefficient $Rfo_{TC}$ of the center frequency, associated with a compressive stress of the packaging resins 14, 15, and 16, was approximately +15 ppm/° C.

$Fr_{TC}$, $Fa_{TC}$, $\epsilon_{TC}$, and Δf/fo were calculated similarly to the first preferred embodiment.

Assigning the characteristic values into Expression (4), the temperature coefficient $fo_{TC}$ of the center frequency was calculated as follows:

$$fo_{TC}=(Fr_{TC}+Fa_{TC})/2+0.225\times\epsilon_{TC}\times(\Delta f/fo)+Rfo_{TC}=(-90-25)/2+K\times 2430\times 0.1+15=12.17 \text{ ppm/° C.}$$

With the target value α of the temperature coefficient of the center frequency being α=18 ppm/° C., |$fo_{TC}$|=12.17 ppm/° C. is sufficiently less than the target value α. The temperature coefficient $fo_{TC}$ of the finished chip-type discriminator for FM detection, shown in FIG. 8, was measured to be approximately +12 ppm/° C. and thus was well in accordance with the above expression.

Thus, a discriminator manufactured using the above material exhibits excellent temperature characteristics.

Although the preferred embodiments have been described in the context of discriminators for FM detection incorporating piezoelectric resonators according to the present invention, the present invention is not limited thereto, and may be applied to piezoelectric resonators using the midpoint of Fr and Fa, for example, an oscillator which uses the midpoint of Fr and Fa as an oscillation point.

Furthermore, the structure of sealing a piezoelectric resonator according to the present invention is not limited to sealing by a cap shown in FIG. 3 or sealing by resins shown in FIGS. 8A and 8B, and a laminated structure similar to the prior art may be used. In that case, because a packaging resin is not used, the temperature coefficient $fo_{TC}$ of the center frequency is calculated according to Expression (3).

Furthermore, the vibration mode of a piezoelectric resonator according to the present invention is not limited to thickness shear vibration mode, and may be, for example, thickness longitudinal vibration mode.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A piezoelectric resonator made of a piezoelectric material, wherein the temperature coefficient $\epsilon_{TC}$ of the capacitance of the piezoelectric material, the bandwidth ratio $\Delta f/fo$, the temperature coefficient $Fr_{TC}$ of the resonance frequency, the temperature coefficient $Fa_{TC}$ of the anti-resonance frequency, and a target value $\alpha$ for the temperature coefficient of the center frequency satisfy the following expression:

$$|(Fr_{TC}+Fa_{TC})/2+K\times\epsilon_{TC}\times(\Delta f/fo)|\leq\alpha$$

where
   K=a coefficient determined according to the impedance at the midpoint between Fr and Fa;
   $\epsilon_{TC}$=A×(the amount of change in capacitance in a measured temperature range)/(the capacitance at a reference temperature×the measured temperature range);
   $\Delta f/fo$=(Fa at the reference temperature−Fr at the reference temperature)/(fo at the reference temperature);
   $Fr_{TC}$=A×(the amount of change in Fr in the measured temperature range)/(Fr at the reference temperature× the measured temperature range);
   $Fa_{TC}$=A×(the amount of change in Fa in the measured temperature range)/(Fa at the reference temperature× the measured temperature range); and
   A=a coefficient of +1 for a positive temperature coefficient and −1 for a negative temperature coefficient.

2. A piezoelectric resonator according to claim 1, wherein $\alpha$=18 ppm/° C.

3. A piezoelectric resonator according to claim 1, wherein K=0.225.

4. An FM detection circuit comprising a bridge circuit that includes resistors connected on three sides thereof and a piezoelectric resonator according to claim 1 connected on the remaining side, wherein an FM intermediate-frequency signal is input across one of two pairs of opposite nodes of the bridge circuit and an output is taken across the other of the two pairs of opposite nodes.

5. A piezoelectric resonator according to claim 1, further comprising a strip-shaped thickness shear vibration mode piezoelectric element.

6. A piezoelectric resonator according to claim 1, wherein the piezoelectric resonator defines a chip-type discriminator.

7. A piezoelectric resonator according to claim 6, wherein the chip-type discriminator includes an insulating substrate, a frame-shaped insulating layer provided on the insulating substrate, electrodes provided on the insulating substrate, a piezoelectric element fixed to the electrodes via a conductive paste, a damping member provided on the piezoelectric element, and a metallic cap fixed on the insulating substrate via the frame-shaped insulating layer.

8. A piezoelectric resonator according to claim 7, wherein the frame-shaped insulating layer is composed of glass paste.

9. A piezoelectric resonator according to claim 7, wherein the damping member is composed of silicone rubber.

10. A piezoelectric resonator made of a piezoelectric material and sealed by a packaging resin, wherein the temperature coefficient $\epsilon_{TC}$ of the capacitance of the piezoelectric material, the bandwidth ratio $\Delta f/fo$, the temperature coefficient $Fr_{TC}$ of the resonance frequency, the temperature coefficient $Fa_{TC}$ of the anti-resonance frequency, the temperature coefficient $Rfo_{TC}$ of the center frequency associated with a stress of the packaging resin, and a target value $\alpha$ for the temperature coefficient of the center frequency satisfy the following expression:

$$|(Fr_{TC}+Fa_{TC})/2+K\times\epsilon_{TC}\times(\Delta f/fo)+Rfo_{TC}|\leq\alpha$$

where
   K=a coefficient determined according to the impedance at the midpoint between Fr and Fa;
   $\epsilon_{TC}$=A×(the amount of change in capacitance in a measured temperature range)/(the capacitance at a reference temperature×the measured temperature range);
   $\Delta f/fo$=(Fa at the reference temperature−Fr at the reference temperature)/(fo at the reference temperature);
   $Fr_{TC}$=A×(the amount of change in Fr in the measured temperature range)/(Fr at the reference temperature× the measured temperature range);
   $Fa_{TC}$=A×(the amount of change in Fa in the measured temperature range)/(Fa at the reference temperature× the measured temperature range); and
   A=a coefficient of +1 for a positive temperature coefficient and −1 for a negative temperature coefficient.

11. A piezoelectric resonator according to claim 10, wherein $\alpha$=18 ppm/° C.

12. A piezoelectric resonator according to claim 10, wherein K=0.225.

13. An FM detection circuit comprising a bridge circuit with resistors connected on three sides thereof and a piezoelectric resonator according to claim 10 connected on the remaining side, wherein an FM intermediate-frequency signal is input across one of two pairs of opposite nodes of the bridge circuit and an output is taken across the other of the two pairs of opposite nodes.

14. A piezoelectric resonator according to claim 10, further comprising a strip-shaped thickness shear vibration mode piezoelectric element.

15. A piezoelectric resonator according to claim 10, wherein the piezoelectric resonator defines a chip-type discriminator.

16. A piezoelectric resonator according to claim 15, wherein the chip-type discriminator includes an insulating substrate, a frame-shaped insulating layer provided on the insulating substrate, electrodes provided on the insulating substrate, a piezoelectric element fixed to the electrodes via a conductive paste, a damping member provided on the piezoelectric element, and a metallic cap fixed on the insulating substrate.

17. A piezoelectric resonator according to claim 16, wherein the frame-shaped insulating layer is composed of glass paste.

18. A piezoelectric resonator according to claim 16, wherein the damping member is composed of silicone rubber.

* * * * *